United States Patent [19]
König et al.

[11] Patent Number: 5,627,730
[45] Date of Patent: May 6, 1997

[54] PRINTED CIRCUIT BOARD ASSEMBLY FOR HIGH SPEED DATA TRANSFER

[75] Inventors: Walter König, Neusaess; Albert Mödl, Stadtbergen; Peter F. Baur, Augsburg, all of Germany

[73] Assignee: NCR Corporation, Dayton, Ohio

[21] Appl. No.: 606,663

[22] Filed: Feb. 26, 1996

Related U.S. Application Data

[63] Continuation of Ser. No. 347,023, Nov. 30, 1994, abandoned.

[51] Int. Cl.$^6$ .............................. H05K 1/11; H01R 13/40
[52] U.S. Cl. .................... 361/784; 361/791; 361/803; 439/591
[58] Field of Search ................................ 361/784–795, 361/803; 439/91, 591

[56] References Cited

U.S. PATENT DOCUMENTS

| | | | |
|---|---|---|---|
| 4,423,435 | 12/1983 | Test, II | 357/65 |
| 4,729,809 | 3/1988 | Dery et al. | 174/94 |
| 4,737,112 | 4/1988 | Jim et al. | 439/66 |
| 4,770,641 | 9/1988 | Rowlette | 439/86 |
| 4,811,081 | 3/1989 | Lyden | 357/80 |
| 4,814,040 | 3/1989 | Ozawa | 156/634 |
| 5,001,302 | 3/1991 | Atsumi | 174/94 R |
| 5,041,183 | 8/1991 | Nakamura et al. | 156/264 |
| 5,136,365 | 8/1992 | Pennisi et al. | 357/72 |
| 5,140,405 | 8/1992 | King et al. | 357/67 |
| 5,140,657 | 8/1992 | Thylen | 385/37 |
| 5,155,302 | 10/1992 | Nguyen | 174/88 R |
| 5,174,763 | 12/1992 | Wilson | 439/66 |
| 5,174,766 | 12/1992 | Yoshizawa et al. | 439/91 |
| 5,183,969 | 2/1993 | Odashima | 174/88 R |
| 5,193,668 | 3/1993 | Fukuchi et al. | 200/512 |
| 5,206,585 | 4/1993 | Chang et al. | 324/158 P |
| 5,219,293 | 6/1993 | Imamura | 439/67 |

*Primary Examiner*—Bot L. Ledynh
*Attorney, Agent, or Firm*—Paul W. Martin

[57] ABSTRACT

A printed circuit board assembly which includes a two-dimensional array of connectors to provide significantly higher data transfer rates than typical one-dimensional connectors, without sacrificing board space. The assembly preferably includes a plurality of connection pads on each printed circuit board. An anisotropically conducting material is placed between the connection pads and the boards pressed together.

12 Claims, 3 Drawing Sheets

PRINTED CIRCUIT BOARD ASSEMBLY FOR HIGH SPEED DATA TRANSFER

This is a continuation of application Ser. No. 08/347,023 filed on Nov. 30, 1994, now abandoned.

BACKGROUND OF THE INVENTION

This invention relates to printed circuit boards in computers, and more specifically to a printed circuit board assembly for high speed data transfer.

Today, processor clock frequencies within computers may exceed 100 MHz. Thus, data may be transferred at high speeds to components such as random access memory (RAM) and peripherals. As long as the components are on the mother board, they can be directly connected to the processor and other system components through the traces on the mother board. However, whenever these components are not integrated into the mother board and added as stand-alone board, a connector between the mother board and the stand-alone board is necessary. This connector may be a multiple pin connector on a peripheral expansion bus or a SIMM connector on a memory expansion bus.

These connectors have their disadvantages. A large amount of space on both printed circuit boards is required for such connectors. Any attempt to decrease the pitch of the pins results in an increase in the price of such connectors. The connector leads for such pins have a shape which is not well-suited for high-speed data transfer.

Therefore, it would be desirable to provide an improved printed circuit board assembly for high speed data transfers.

SUMMARY OF THE INVENTION

Thus, in accordance with the teachings of the present invention, a printed circuit board assembly for high speed data transfer is provided. The apparatus includes a plurality of metal connection pads arranged in a two-dimensional pattern on a connecting surface of the first printed circuit board, a plurality of metal connection pads arranged in the two-dimensional pattern on a connecting surface of the second printed circuit board which faces the connecting surface of the first printed circuit board, and an anisotropically conducting sheet between the first and second printed circuit boards and having a surface area large enough to cover the connection pads of the first and second printed circuit boards.

It is therefore an object of the present invention to provide a printed circuit board assembly for high speed data transfer.

It is another object of the present invention to provide a printed circuit board assembly for high speed data transfer which includes a two-dimensional array of connectors.

It is another object of the present invention to provide a printed circuit board assembly for high speed data transfer at frequencies up to about 2 GHz.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DESCRIPTION OF THE PREFERRED EMBODIMENT

Figure 1:
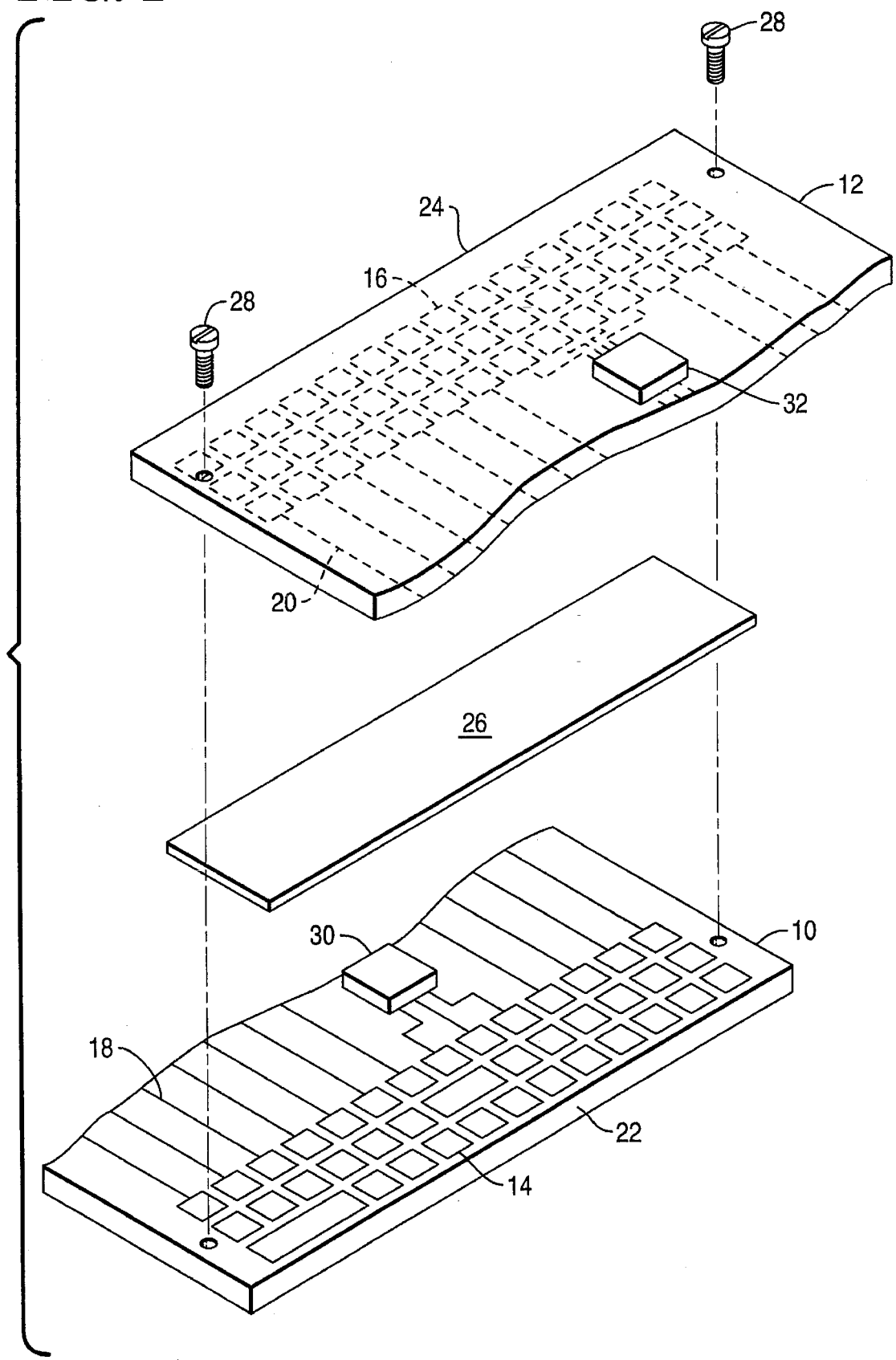
FIG. 1 is an exploded view of first and second printed circuit boards and the apparatus of the present invention.
Figure 2:
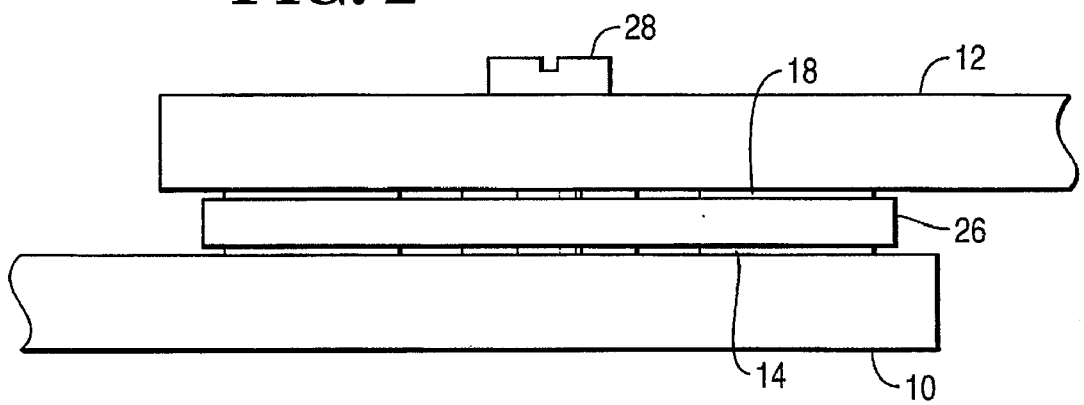
FIG. 2 is an end view of the first and second printed circuit boards coupled together using the apparatus of the present invention.

Referring now to FIGS. 1 and 2, printed circuit boards 10 and 12 are to be connected together into an assembly 30. Printed circuit board 10 is preferably a mother board, while printed circuit board 12 may be a peripheral adapter card, a memory expansion card, or a daughter board.

Printed circuit boards 10 and 12 include connection pads 14 and 16, which are connected to the many electronic components of printed circuit boards 10 and 12 through traces 18 and 20. For signal traces, each connection pad on printed circuit board 10 preferably has a corresponding connection pad on printed circuit board 12. However, power and ground connection pads may have different geometries on each board. For example, a single large power connection pad on one printed circuit board may connect to many smaller power connection pads on the other printed circuit board.

Figure 3:
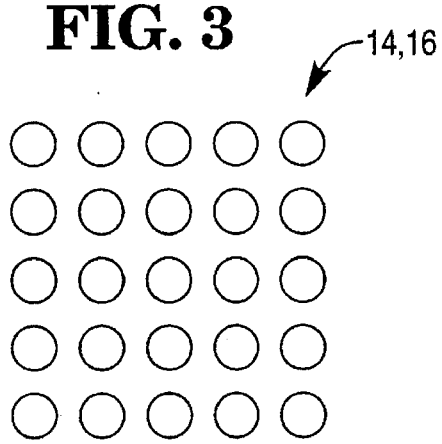
FIG. 3 is a top view of a second embodiment of a pattern for arranging the connection pads of the present invention.
Figure 4:
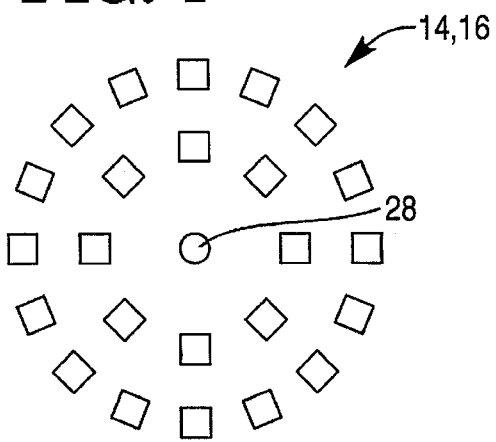
FIG. 4 is a top view of a third embodiment of a pattern for arranging the connection pads of the present invention.
Figure 5:
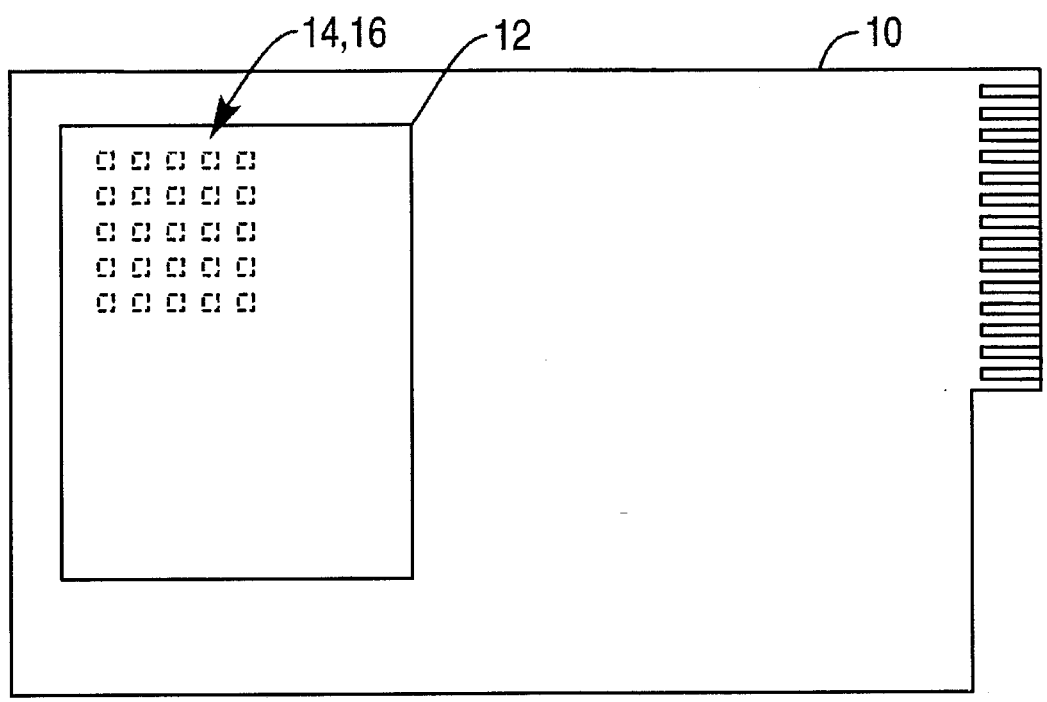
FIG. 5 is a top view of a second embodiment of the present invention.

Connection pads 14 and 16 are arranged in two-dimensional arrays, which may have a rectangular shape (FIG. 1), a square shape (FIG. 3), or an ovular or circular shape (FIG. 4), for example. Connection pads 14 and 16 are preferably flush with the connecting surfaces of printed circuit boards 10 and 12 as shown in FIG. 1, but they may be raised slightly higher than the connecting surfaces as shown in FIG. 2. The rows of FIGS. 1 and 2 are arranged parallel and adjacent to the connecting sides 22 and 24 of printed circuit boards 10 and 12, however, connection pads 14 could be anywhere within the surface area of printed circuit board 10. For example, a mother-daughter board combination shown in FIG. 5 requires connection pads 14 to be located away from sides 22.

Between connection pads 14 and 16 is a thin mat 26 of anisotropically conductive material. This material is commercially available. The boards are then pressed together and held in place by fasteners 28.

Advantageously, more connections per square inch of board surface can be made than with the typical one-dimensional multiple pin connector. Connection pads 14 and 16 may be arranged to meet specific space requirements. Here, connection pads 14 and 16 are shown as square in shape, but they may also be circular (FIG. 3) or any other shape to further minimize space requirements.

The electrical characteristics are also better and provide significantly higher maximum data transfer rates (bits per second) than ordinary connection schemes. The apparatus of the present invention is suitable for high-frequency applications up to 2 GHz, largely due to the shorter distance between the signal connectors and the ground connector, the smaller inductance, and larger contact areas, all compared to traditional pin connectors.

Although the invention has been described with particular reference to certain preferred embodiments thereof, variations and modifications of the present invention can be effected within the spirit and scope of the following claims.

What is claimed is:

1. An apparatus for coupling first and second printed circuit boards comprising:

a first plurality of metal connection pads arranged in a first plurality of lines in a first two-dimensional pattern on a connecting surface of the first printed circuit board;

wherein at least one of the first plurality of lines includes at least one of the first plurality of metal connection pads and at least another one of the first plurality of lines includes at least two of the first plurality of metal connection pads;

a second plurality of metal connection pads arranged in a second plurality of lines in a second two dimensional pattern on a connecting surface of the second printed circuit board which faces the connecting surface of the first printed circuit board;

wherein at least one of the second plurality of lines includes at least one of the second plurality of metal connection pads and at least another one of the second plurality of lines includes at least two of the second plurality of metal connection pads; and an anisotropically conducting sheet between the first and second printed circuit boards and having a surface area large enough to cover the connection pads of the first and second printed circuit boards.

2. The apparatus as recited in claim 1, wherein the first printed circuit board is a mother board and the second printed circuit board is a memory expansion card.

3. The apparatus as recited in claim 1, wherein the first printed circuit board is a mother board and the second printed circuit board is a peripheral card.

4. The apparatus as recited in claim 1, wherein the first printed circuit board is a mother board and the second printed circuit board is a daughter board.

5. The apparatus as recited in claim 1, further comprising:

a component on the second printed circuit board; and a component on the first printed circuit board;

wherein the components on the first and second printed circuit boards operate at frequencies up to 2 GHz.

6. The apparatus as recited in claim 1, further comprising:

a fastener for coupling the first printed circuit board to the second printed circuit board.

7. The apparatus as recited in claim 1, wherein the first and second pluralities of lines of connection pads on the first and second printed circuit boards are parallel.

8. The apparatus as recited in claim 1, wherein the first and second pluralities of lines of connection pads on the first and second printed circuit boards are straight.

9. The apparatus as recited in claim 1, wherein the connection pads on the first printed circuit board are arranged adjacent the periphery of the connecting surface of the first printed circuit board.

10. The apparatus as recited in claim 1, wherein the connection pads on the first printed circuit board are arranged within the interior of the connecting surface of the first printed circuit board.

11. A method of connecting a first printed circuit board to a second printed circuit board comprising the steps of:

providing a first plurality of metal connection pads arranged in a first plurality of lines in a first two-dimensional pattern on a connecting surface of the first printed circuit board;

wherein at least one of the first plurality of lines includes at least one of the first plurality of metal connection pads and at least another one of the first plurality of lines includes at least two of the first plurality of metal connection pads;

providing a second plurality of metal connection pads arranged in a second plurality of lines in a second two dimensional pattern on a connecting surface of the second printed circuit board which faces the connecting surface of the first printed circuit board;

wherein at least one of the second plurality of lines includes at least one of the second plurality of metal connection pads and at least another one of the second plurality of lines includes at least two of the second plurality of metal connection pads;

providing an anisotropically conducting pad between the metal connection pads on the first printed circuit board and the metal connection pads on the second printed circuit board; and fastening the first and second printed circuit boards together.

12. A method of transferring data between a component on a first printed circuit board and another component on a second printed circuit board comprising the steps of:

providing a first plurality of metal connection pads arranged in a first plurality of lines in a first two-dimensional pattern on a connecting surface of the first printed circuit board;

wherein at least one of the first plurality of lines includes at least one of the first plurality of metal connection pads and at least another one of the first plurality of lines includes at least two of the first plurality of metal connection pads;

providing a second plurality of metal connection pads arranged in a second plurality of lines in a second two dimensional pattern on a connecting surface of the second printed circuit board which faces the connecting surface of the first printed circuit board;

wherein at least one of the second plurality of lines includes at least one of the second plurality of metal connection pads and at least another one of the second plurality of lines includes at least two of the second plurality of metal connection pads;

providing an anisotropically conducting pad between the metal connection pads on the first printed circuit board and the metal connection pads on the second printed circuit board;

fastening the first and second printed circuit boards together; and transferring data from the one component on the first printed circuit board to the other component on the second printed circuit board at frequencies up to about 2 GHz.

* * * * *

UNITED STATES PATENT AND TRADEMARK OFFICE
CERTIFICATE OF CORRECTION

PATENT NO. : 5,627,730
DATED : May 6, 1997
INVENTOR(S) : Walter Konig et al.

It is certified that error appears in the above-identified patent and that said Letters Patent is hereby corrected as shown below:

Column 3,
Lines 2, 4, 7, 10, 14, 17, 41, 44 and 57, delete "lines" and substitute -- rows --.
Line 18, delete "and".
Line 19, after "sheet" insert -- inserted --.
Line 22, after "boards" insert -- ; and fasteners which hold the first and second printed circuit boards together and retain the anisotropically conductive sheet between the first and second printed circuit boards --.

Column 4,
Lines 3, 6, 9, 13, 16, 28, 31, 34, 37, 41 and 44, delete "lines" and substitute -- rows --.
Lines 23 and 51, after 'together" insert -- to retain the anisotropically conducting pad between the first and second printed circuit boards --.

Signed and Sealed this

Seventeenth Day of August, 2004

JON W. DUDAS
*Acting Director of the United States Patent and Trademark Office*